(12) United States Patent
Tsukiyama et al.

(10) Patent No.: US 11,978,682 B2
(45) Date of Patent: May 7, 2024

(54) PACKAGE, AND METHOD FOR MANUFACTURING POWER SEMICONDUCTOR MODULE

(71) Applicants: NGK Electronics Devices, Inc., Mine (JP); NGK Insulators, Ltd., Nagoya (JP)

(72) Inventors: Yoshio Tsukiyama, Yamaguchi (JP); Akiyoshi Osakada, Mine (JP); Teppei Yamaguchi, Shimonoseki (JP)

(73) Assignees: NGK ELECTRONICS DEVICES, INC., Mine (JP); NGK INSULATORS, LTD., Nagoya (JP)

( * ) Notice: Subject to any disclaimer, the term of this patent is extended or adjusted under 35 U.S.C. 154(b) by 356 days.

(21) Appl. No.: 17/455,719

(22) Filed: Nov. 19, 2021

(65) Prior Publication Data

US 2022/0077011 A1  Mar. 10, 2022

Related U.S. Application Data

(63) Continuation of application No. PCT/JP2020/017032, filed on Apr. 20, 2020.

(30) Foreign Application Priority Data

Jun. 25, 2019  (JP) .................................. 2019-117407

(51) Int. Cl.
*H01L 23/047*  (2006.01)
*H01L 21/52*  (2006.01)
(Continued)

(52) U.S. Cl.
CPC ............ *H01L 23/047* (2013.01); *H01L 21/52* (2013.01); *H01L 23/36* (2013.01);
(Continued)

(58) Field of Classification Search
CPC . H01L 23/047; H01L 23/36; H01L 23/49541; H01L 23/49579; H01L 21/52; H01L 24/73; H01L 2224/73265
See application file for complete search history.

(56) References Cited

U.S. PATENT DOCUMENTS

| 2004/0184239 A1* | 9/2004 | Zimmerman ........... H01L 23/10 257/E23.185 |
|---|---|---|
| 2019/0052042 A1 | 2/2019 | Matsushita et al. |
| 2019/0067251 A1 | 2/2019 | Bando et al. |

FOREIGN PATENT DOCUMENTS

| JP | 2003-282751 A | 10/2003 |
|---|---|---|
| JP | 2005-150133 A | 6/2005 |

(Continued)

OTHER PUBLICATIONS

International Search Report and Written Opinion (Application No. PCT/JP2020/017032) dated Jun. 30, 2020 (with English translation).

*Primary Examiner* — Peniel M Gumedzoe
(74) *Attorney, Agent, or Firm* — BURR PATENT LAW, PLLC

(57) ABSTRACT

A first frame is supported by a heat sink plate, surrounds an unmounted region of the heat sink plate, contains a resin, and has a first surface. A second frame contains a resin, and has a second surface opposing the first surface. An external terminal electrode passes between the first surface and the second surface. An adhesive layer contains a resin, and includes a lower portion, an upper portion, and an intermediate portion. The lower portion connects the external terminal electrode and the first surface to each other. The upper portion connects the external terminal electrode and the second surface to each other. The intermediate portion is (Continued)

disposed within a through hole of the external terminal electrode, and connects the lower portion and the upper portion to each other.

8 Claims, 11 Drawing Sheets

(51) Int. Cl.
    *H01L 23/36*     (2006.01)
    *H01L 23/495*    (2006.01)
    *H01L 23/00*     (2006.01)

(52) U.S. Cl.
    CPC .. *H01L 23/49541* (2013.01); *H01L 23/49579* (2013.01); *H01L 24/73* (2013.01); *H01L 2224/73265* (2013.01)

(56) References Cited

FOREIGN PATENT DOCUMENTS

| | | |
|---|---|---|
| JP | 2010-219441 A | 9/2010 |
| JP | 2012-049224 A | 3/2012 |
| JP | 2018-142617 A | 9/2018 |
| JP | 2019-033196 A | 2/2019 |
| JP | 2019-046899 A | 3/2019 |

* cited by examiner

PACKAGE, AND METHOD FOR MANUFACTURING POWER SEMICONDUCTOR MODULE

BACKGROUND OF THE INVENTION

Field of the Invention

The present invention relates to a package and a method for manufacturing a power semiconductor module, and, in particular, to a package to which a lid is to be attached to form a sealed space for sealing a power semiconductor element without a gross leak and a method for manufacturing a power semiconductor module including the power semiconductor element sealed without a gross leak.

Description of the Background Art

A container forming a sealed space for sealing a power semiconductor element is required to be highly hermetic not to cause a gross leak depending on a type and a use of the power semiconductor element. In particular, a high frequency semiconductor element is often required to be sealed without a gross leak. A container to which a lid is to be attached to form a sealed space for sealing a power semiconductor element is also referred to as a package in the present application. The package has a cavity, and the sealed space is obtained by sealing the cavity with the lid.

According to technology disclosed in Japanese Patent Application Laid-Open No. 2005-150133, a heat sink plate, a ceramic frame, and an external connection terminal are first connected to one another. A package having a cavity is thereby prepared. The heat sink plate is made of a composite material. As the composite material, a Cu—W-based composite metal plate, a Cu—Mo-based composite metal plate, and a clad composite metal plate including a Cu—Mo-based alloy metal plate and Cu plates applied to opposite surfaces of the Cu—Mo-based alloy metal plate are given as examples. The heat sink plate and the ceramic frame are joined by Ag—Cu brazing at approximately 780° C. to 900° C. A high frequency semiconductor element is mounted on the package. A lid is adhered to an upper surface portion of the ceramic frame to seal the cavity. In other words, the high frequency semiconductor element is hermetically sealed in a sealed space.

A use of the composite material as a material for the heat sink plate as described above can bring the coefficient of thermal expansion of the heat sink plate closer to that of the ceramic frame and that of the semiconductor element. Rupture due to a difference in thermal expansion and contraction can thus be prevented. This allows for joining of the ceramic frame and the semiconductor element to the heat sink plate at a high temperature. In the above-mentioned technology, the heat sink plate and the ceramic frame have already been joined to each other when the semiconductor element is mounted. To mount the semiconductor element not to impair the joining, there is a restriction that the semiconductor element should be mounted at a temperature lower than a temperature at which the ceramic frame is joined. In the above-mentioned technology, the ceramic frame is joined at a high temperature of approximately 780° C. to 900° C., and thus the joining is little adversely affected by heating at about the temperature at which the semiconductor element is mounted. Furthermore, the coefficient of thermal expansion of the heat sink plate is close to that of the semiconductor element, so that rupture of the semiconductor element due to thermal stress at mounting can be avoided even if the mounting temperature is high to some extent. The semiconductor element can thus be mounted by brazing, for example, at approximately 400° C., which is a relatively high temperature as the mounting temperature.

According to technology disclosed in Japanese Patent Application Laid-Open No. 2003-282751, a Cu or Cu-based metal plate is used as a heat sink plate. Cu is an excellent material in terms of being capable of having a high thermal conductivity of more than 300 W/m·K while being relatively inexpensive. In contrast to the above-mentioned technology disclosed in Japanese Patent Application Laid-Open No. 2005-150133 in which the heat sink plate is made of the composite material, the heat sink plate having a high thermal conductivity can be obtained at a low cost. According to the technology, a semiconductor element is first mounted on the heat sink plate by brazing. Next, a frame to which an external connection terminal is joined in advance is joined to the heat sink plate to surround the semiconductor element. By using a low melting point joining material for the joining, the frame is joined at a temperature lower than a temperature at which the semiconductor element is brazed. Next, a lid is joined to a side of an upper surface of the frame to seal a cavity. In other words, the semiconductor element is hermetically sealed in a sealed space. A high frequency power module is thereby obtained.

Japanese Patent Application Laid-Open No. 2012-49224 discloses a method for manufacturing a mounting structure. According to the manufacturing method, a heat dissipation substrate having a mounting region for an electronic component is prepared. A ceramic frame is joined, through a thermosetting resin, to the heat dissipation substrate to surround the mounting region. A connection terminal has been joined to the ceramic frame through a joining material. The joining material is a brazing material, such as silver, copper, gold, aluminum, and magnesium. The electronic component is joined, through a low melting point alloy, to the mounting region at a temperature lower than a temperature at which the thermosetting resin is pyrolyzed. The heat dissipation substrate is made of a metallic material, such as copper, iron, tungsten, molybdenum, nickel, and cobalt, an alloy containing such metallic materials, or a composite material thereof, for example, and has a thermal conductivity of 15 W/m·K or more and 450 W/m·K or less, for example. The thermosetting resin has a lower thermal conductivity than the low melting point alloy. According to description of the document, heat having been transferred to the heat dissipation substrate is less likely to be transferred to the thermosetting resin, so that the thermosetting resin is less likely to be thermally expanded, and the occurrence of cracking of the thermosetting resin can be suppressed. According to description of the document, separation between the ceramic frame and the heat dissipation substrate can consequently effectively be suppressed to maintain good hermeticity in the region surrounded by the ceramic frame.

According to the above-mentioned technology disclosed in Japanese Patent Application Laid-Open No. 2003-282751, the cavity of the package is formed by joining the frame to the heat sink plate after mounting of the semiconductor element. A process after mounting of the semiconductor element is thus complicated in this technology compared with the above-mentioned technology disclosed in Japanese Patent Application Laid-Open No. 2005-150133. This interferes with prompt completion of a semiconductor module after mounting of the semiconductor element. This is not desirable for manufacturers of the semiconductor module.

Furthermore, the semiconductor module including the package is often thermally expanded and contracted when being in use. Thus, not only prompt completion of a power semiconductor module after mounting of a power semiconductor element but also prevention of the occurrence of a gross leak due to damage caused by the difference in thermal expansion and contraction when the power semiconductor module is in use are desired. According to the abovementioned technology disclosed in Japanese Patent Application Laid-Open No. 2012-49224, the frame and the heat dissipation substrate (heat sink plate) are likely to have a large difference in coefficient of thermal expansion because the frame is made of ceramic. The large difference in coefficient of thermal expansion can cause large thermal stress. Even if thermal stress in mounting the semiconductor element does not cause hermeticity deterioration, hermeticity is likely to be deteriorated in actual use thereafter due to thermal stress under repeated temperature changes resulting from external environmental changes and the like. To prevent the problem, it is desirable that the frame contain a resin. For joining of the frame containing the resin, a use of a brazing material is difficult, and a use of an adhesive layer containing a resin is suitable. However, an adhesion strength between the adhesive layer containing the resin and the connection terminal made of metal is likely to be low, and, as a result, separation between the adhesive layer and the connection terminal (an external terminal electrode) is likely to occur. A gross leak is thus sometimes caused due to separation of the adhesive layer.

SUMMARY

The present invention has been conceived to solve a problem as described above, and it is an object of the present invention to provide a package and a method for manufacturing a power semiconductor module enabling prevention of a gross leak caused by separation between an adhesive layer and an external terminal electrode.

A package according to one aspect of the present invention is a package to which a lid is to be attached to form a sealed space for sealing a power semiconductor element without a gross leak. The package includes a heat sink plate, a first frame, a second frame, an external terminal electrode, and an adhesive layer. The heat sink plate has an unmounted region where the power semiconductor element is to be mounted, and is made of metal. The first frame is supported by the heat sink plate, surrounds the unmounted region of the heat sink plate in plan view, contains a resin, and has a first surface. The second frame contains a resin, and has a second surface opposing the first surface. The external terminal electrode passes between the first surface of the first frame and the second surface of the second frame, and has a through hole between the first surface of the first frame and the second surface of the second frame. The adhesive layer contains a resin, and includes a first portion, a second portion, and a third portion. The first portion connects the external terminal electrode and the first surface of the first frame to each other. The second portion connects the external terminal electrode and the second surface of the second frame to each other. The third portion is disposed within the through hole of the external terminal electrode, and connects the first portion and the second portion to each other.

At least one of the first frame and the second frame preferably includes a protruding portion protruding toward the through hole of the external terminal electrode. The protruding portion is preferably spaced apart from the external terminal electrode. The protruding portion preferably penetrates into the through hole of the external terminal electrode.

The external terminal electrode may have a surface which is in contact with the adhesive layer and made of gold. The adhesive layer may contain an epoxy resin.

A method for manufacturing a power semiconductor module according to one aspect of the present invention includes the following process. A package is prepared. The package includes a heat sink plate, a first frame, a second frame, an external terminal electrode, and an adhesive layer. The heat sink plate is made of metal. The first frame is supported by the heat sink plate, contains a resin, and has a first surface. The second frame contains a resin, and has a second surface opposing the first surface. The external terminal electrode passes between the first surface of the first frame and the second surface of the second frame, and has a through hole between the first surface of the first frame and the second surface of the second frame. The adhesive layer contains a resin, and includes a first portion, a second portion, and a third portion. The first portion connects the external terminal electrode and the first surface of the first frame to each other. The second portion connects the external terminal electrode and the second surface of the second frame to each other. The third portion is disposed within the through hole of the external terminal electrode, and connects the first portion and the second portion to each other. A power semiconductor element is then mounted on the heat sink plate. A lid is then attached to the second frame to seal the power semiconductor element without a gross leak.

It is preferable that, when the power semiconductor element is mounted, the heat sink plate and the power semiconductor element be joined to each other through a joining layer containing a thermosetting resin and a metal.

According to the package according to the one aspect of the present invention, the adhesive layer includes the first portion connecting the external terminal electrode and the first surface of the first frame to each other, the second portion connecting the external terminal electrode and the second surface of the second frame to each other, and the third portion disposed within the through hole of the external terminal electrode, and connecting the first portion and the second portion to each other. The third portion fixes relative positions of the first portion and the second portion along the thickness. Separation between the first portion or the second portion and the external terminal electrode along the thickness is thereby prevented. A gross leak caused due to separation of the adhesive layer can thus be prevented.

At least one of the first frame and the second frame may include the protruding portion protruding toward the through hole of the external terminal electrode. In this case, the volume of a space where the adhesive layer can be formed near the through hole is reduced. Formation of a void near the through hole is thus prevented. Generation of a gas from the void into the sealed space can be prevented.

The protruding portion is preferably spaced apart from the external terminal electrode. In this case, disturbance of relative positions of the first frame or the second frame and the external terminal electrode due to a collision therebetween at the manufacture of the package is prevented. The occurrence of a gross leak due to an error of the positions can thus be prevented.

The protruding portion preferably penetrates into the through hole of the external terminal electrode. In this case, the volume of the space where the adhesive layer can be formed near the through hole is more sufficiently reduced. Formation of the void near the through hole is thus more sufficiently prevented. Generation of the gas from the void into the sealed space can thus more sufficiently be prevented.

The external terminal electrode may have the surface which is in contact with the adhesive layer and made of gold. A combination of the surface made of gold and the resin-based adhesive layer is typically likely to lead to reduction in adhesion strength. According to the above-mentioned package according to the one aspect, separation between the external terminal electrode and the adhesive layer due to a low adhesion strength can effectively be prevented.

The adhesive layer may contain the epoxy resin. An adhesion strength to each of the first frame and the second frame containing the resin is thus likely to be secured. On the other hand, according to the above-mentioned package according to the one aspect, separation between the adhesive layer and the external terminal electrode is prevented for the above-mentioned reason. As described above, separation in a stacked structure of the first frame, the adhesive layer, the external terminal electrode, and the second frame as a whole can be prevented. In particular, an adhesion strength between the surface made of gold of the external terminal electrode and the adhesive layer containing the epoxy resin is likely to be low, but separation therebetween is prevented for the above-mentioned reason.

According to the method for manufacturing the power semiconductor module according to the one aspect of the present invention, after the adhesive layer connecting the first frame, the external terminal electrode, and the second frame to one another is formed, the power semiconductor element is mounted on the heat sink plate. The mounting requires heating, and thus the temperature of the adhesive layer increases. A material for the adhesive layer is thus limited to a highly heat resistant material. Priority is thus less likely to be given to securement of the adhesion strength between the adhesive layer and the external terminal electrode. On the other hand, according to the above-mentioned method for manufacturing the power semiconductor module according to the one aspect, the adhesive layer includes the first portion connecting the external terminal electrode and the first surface of the first frame to each other, the second portion connecting the external terminal electrode and the second surface of the second frame to each other, and the third portion disposed within the through hole of the external terminal electrode, and connecting the first portion and the second portion to each other. The third portion fixes the relative positions of the first portion and the second portion along the thickness. Separation between the first portion or the second portion and the external terminal electrode along the thickness is thereby prevented. A gross leak caused due to separation of the adhesive layer can thus be prevented.

It is preferable that, when the power semiconductor element is mounted, the heat sink plate and the power semiconductor element be joined to each other through the joining layer containing the thermosetting resin and the metal. The joining layer contains the metal to enhance heat dissipation from the power semiconductor element to the heat sink plate. The joining layer contains the resin to relieve thermal stress applied from the heat sink plate to the power semiconductor element through the joining layer. Rupture of the power semiconductor element due to thermal stress is thus less likely to occur.

These and other objects, features, aspects and advantages of the present invention will become more apparent from the following detailed description when taken in conjunction with the accompanying drawings.

DESCRIPTION OF THE PREFERRED EMBODIMENTS

Figure 1:
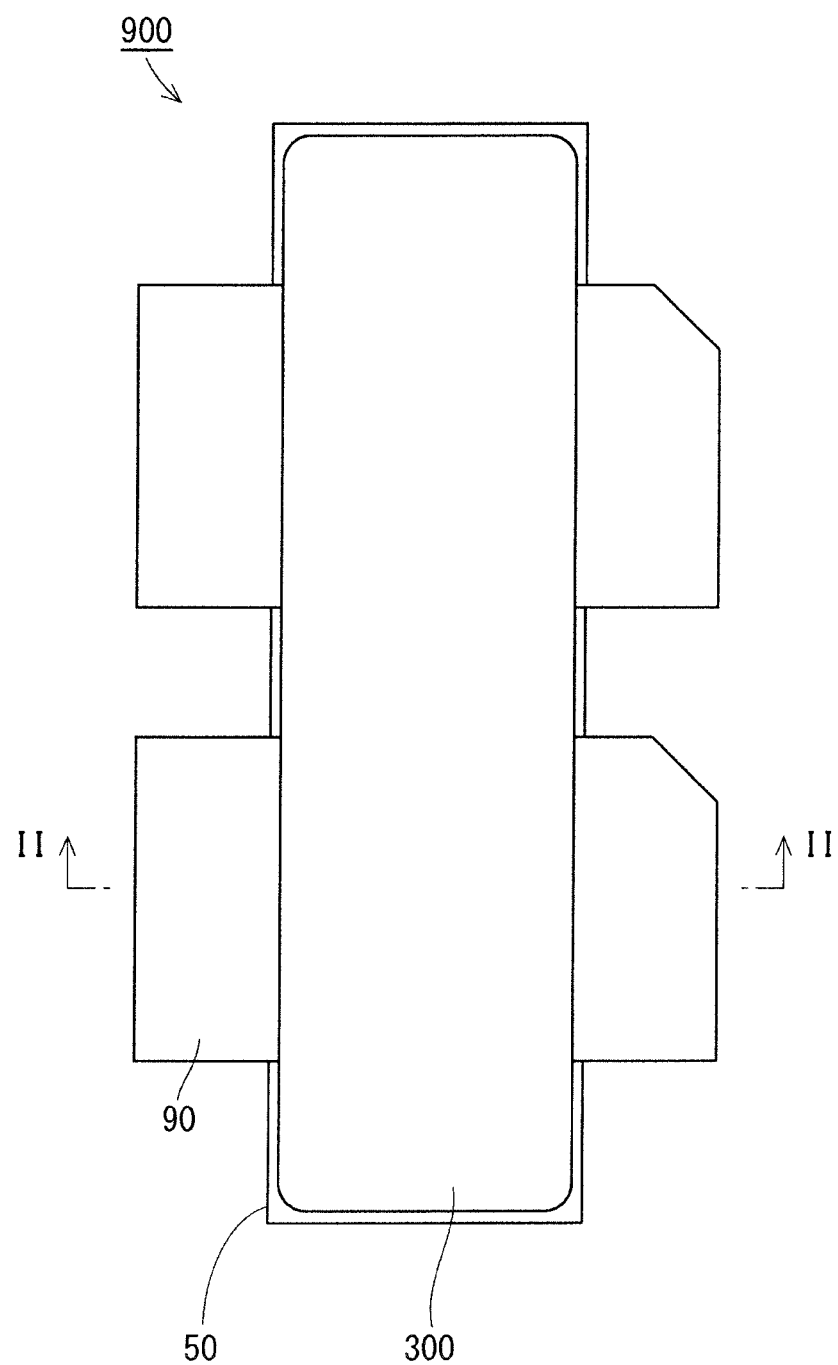
FIG. 1 is a top view schematically showing a configuration of a power semiconductor module in Embodiment 1 of the present invention.

Embodiments of the present invention will be described below with reference to the drawings. The same or corresponding components bear the same reference signs in the drawings below, and description thereof will not be repeated.

Embodiment 1

Figure 2:
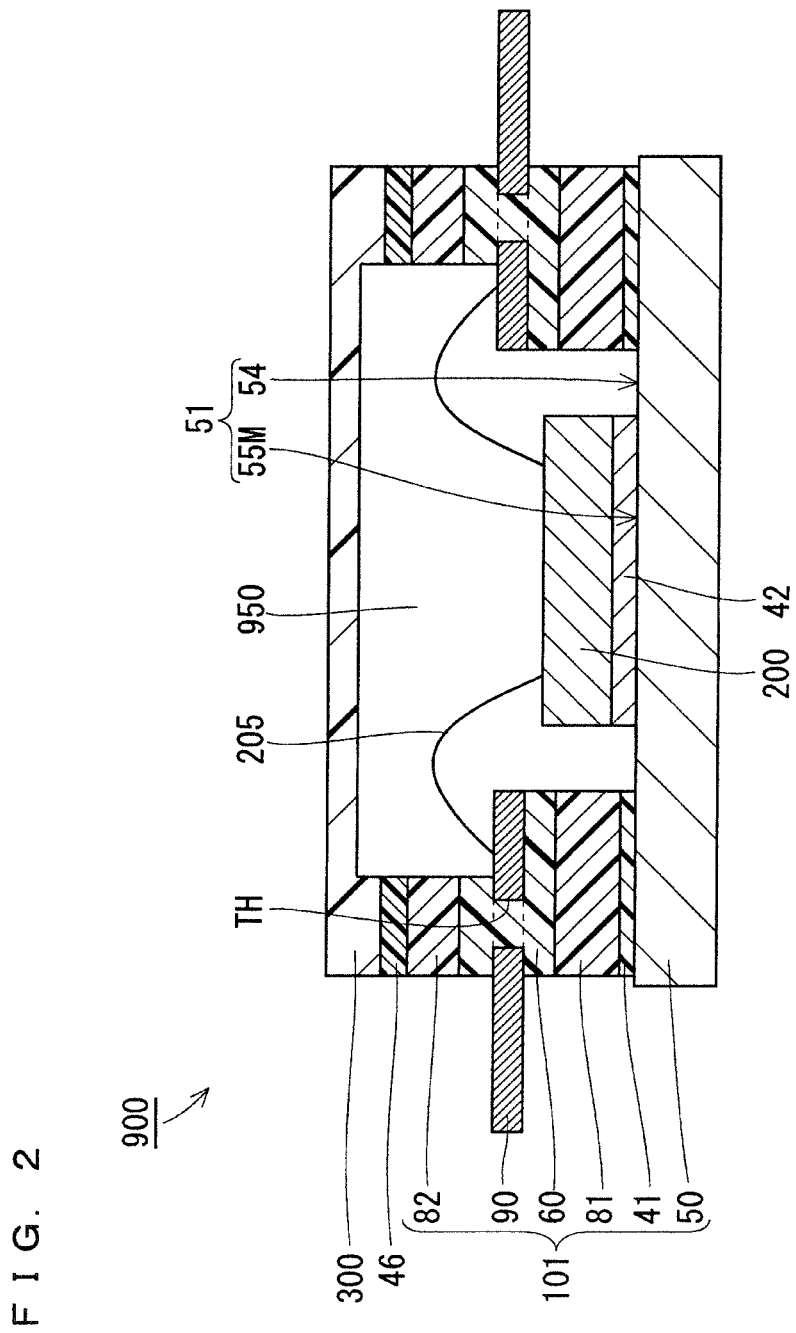
FIG. 2 is a schematic cross-sectional view taken along the line II-II of FIG. 1.

FIG. 1 is a top view schematically showing a configuration of a power semiconductor module 900 in Embodiment 1. FIG. 2 is a schematic cross-sectional view taken along the line II-II of FIG. 1. The power semiconductor module 900 includes a package 101, a power semiconductor element 200, and a lid 300. The power semiconductor module 900 also includes an adhesive layer 46, a joining layer 42, and a bonding wire 205 (wiring member).

The power semiconductor element 200 may be a high frequency semiconductor element. The high frequency semiconductor element is a semiconductor element operating at a frequency of approximately several tens of megahertz (e.g., 30 MHz) or more and 30 GHz or less. In this case, the power semiconductor module 900 is a high frequency module. The power semiconductor element 200 suitable for high frequency applications is typically a lateral diffused MOS (LDMOS) transistor or a gallium nitride (GaN) transistor.

The power semiconductor element 200 is disposed on a mounted region 55M of a heat sink plate 50 of the package 101. It is preferable that the mounted region 55M and the power semiconductor element 200 be joined to each other through the joining layer 42 containing a thermosetting resin and a metal. The thermosetting resin of the joining layer 42 preferably includes an epoxy resin. The metal of the joining layer 42 preferably includes silver.

The package 101 includes the heat sink plate 50 and a lower frame 81 (first frame), which will be described in details below. The heat sink plate 50 has the mounted region 55M within the lower frame 81 in plan view. In other words, the heat sink plate 50 has the mounted region 55M surrounded by the lower frame 81 in plan view. The power semiconductor element 200 is mounted on the mounted region 55M of the heat sink plate 50.

The lid 300 is attached to the package 101. Specifically, the adhesive layer 46 adheres the package 101 and the lid 300 to each other. A sealed space 950 for sealing the power semiconductor element 200 without a gross leak is thereby formed. The power semiconductor element 200 is thus highly hermetically protected against an external environment to prevent ingress of water vapor and other gases in the atmosphere. It is preferable that the sealed space 950 be environmentally resistant to 500 cycles of a temperature change between −65° C. and +150° C. Specifically, the sealed space 950 preferably has no gross leak even after subjected to the above-mentioned temperature change. A gross leak test is specifically a test in which a sample is immersed, for 30 seconds, in Fluorinert™ as a high boiling point solvent heated to 120° C.±10° C., and a defect is determined when bubbles are generated during immersion.

A heat sink adhesive layer 41 adheres the lower frame 81 and the heat sink plate 50 to each other. The heat sink adhesive layer 41 secures hermeticity between the heat sink plate 50 and the lower frame 81. An adhesive layer 60 adheres the lower frame 81, an external terminal electrode 90, and an upper frame 82 to one another. The adhesive layer 60 secures hermeticity among the lower frame 81, the external terminal electrode 90, and the upper frame 82. Hermeticity secured by the heat sink adhesive layer 41 and the adhesive layer 60 is preferably heat resistant to heat treatment at 260° C. for two hours. A test to determine heat resistance may be conducted by conducting, after the package 101 (FIG. 5) is subjected to heat treatment at 260° C. for two hours, the gross leak test on the package 101 to which the lid 300 (FIG. 2) has sufficiently hermetically been attached. If hermeticity is heat resistant to heat treatment at 260° C. for two hours, heat resistance to typical heat treatment in a process of mounting the power semiconductor element 200 (FIG. 2) using a pasty adhesive containing the thermosetting resin and the metal is secured. In a case where the lid 300 and a structure to attach the lid 300 are sufficiently heat resistant in preparation for the test, the lid 300 may be attached before heat treatment. A specific method for conducting the gross leak test is as described above.

The bonding wire 205 connects the power semiconductor element 200 and the external terminal electrode 90 of the package 101 to each other. The power semiconductor element 200 and the external terminal electrode 90 are thereby electrically connected to each other. Electrical connection between the power semiconductor element 200 and the external terminal electrode 90 may be secured by a wiring member different from the bonding wire 205, and, in this case, the bonding wire 205 is not necessarily required.

Figure 3:
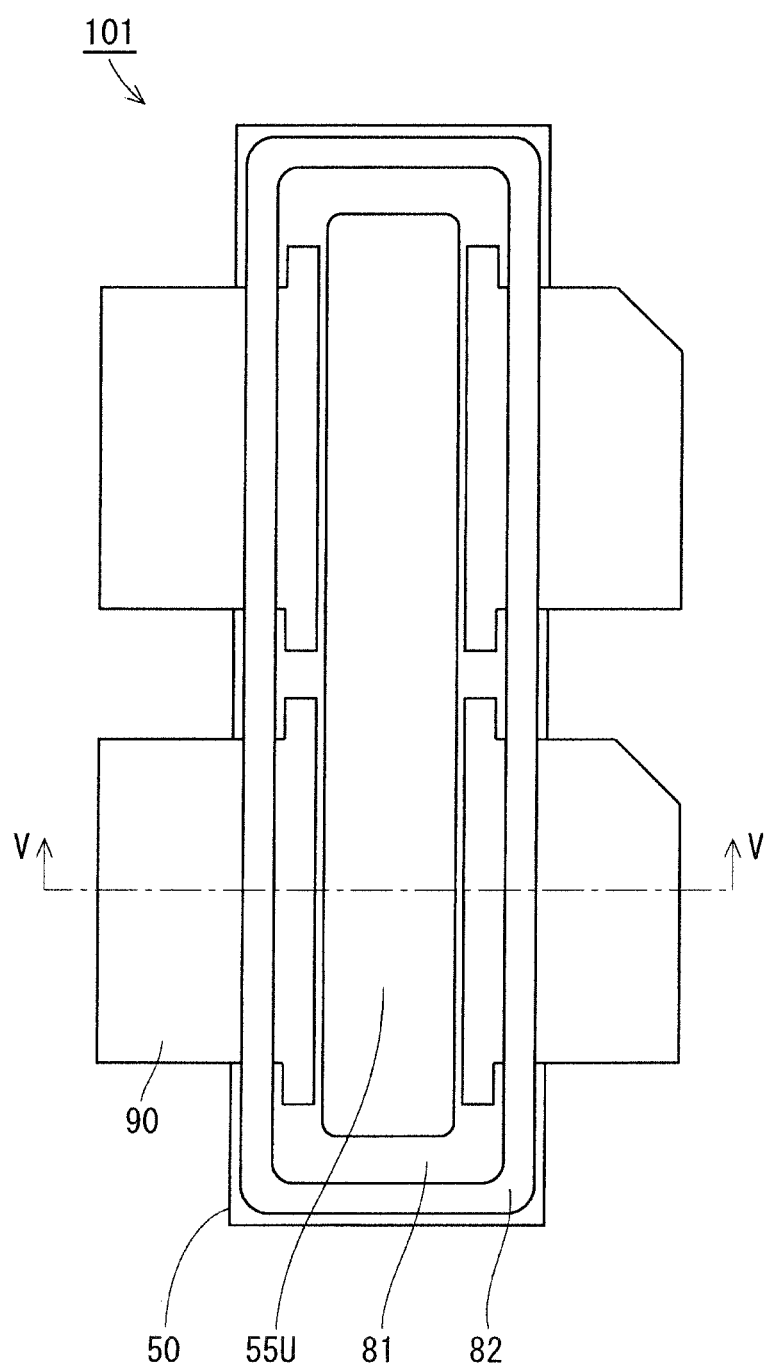
FIG. 3 is a top view schematically showing a configuration of a package in Embodiment 1 of the present invention.
Figure 4:
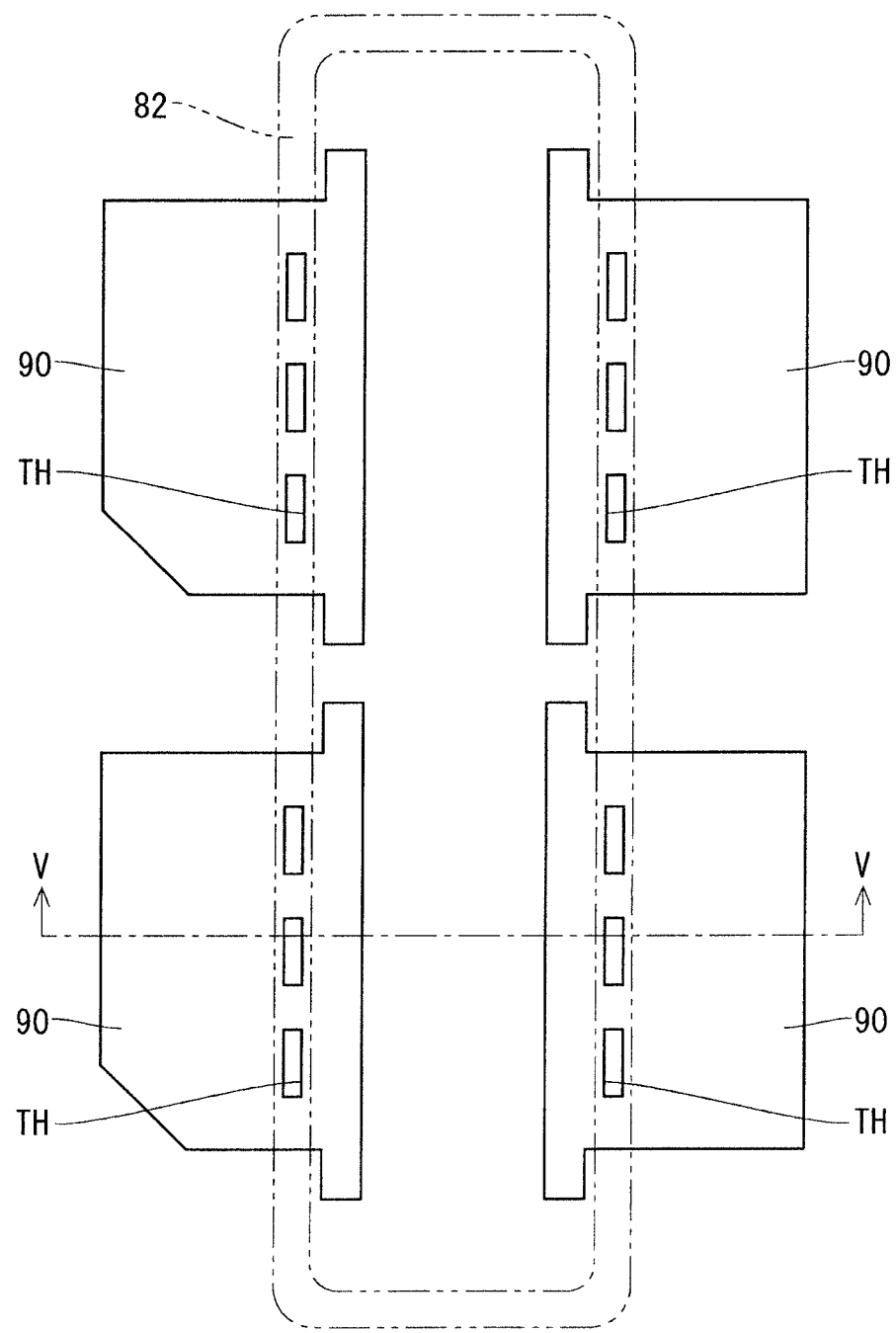
FIG. 4 is a top view schematically showing a configuration of an external terminal electrode and a second frame in Embodiment 1 of the present invention.
Figure 5:
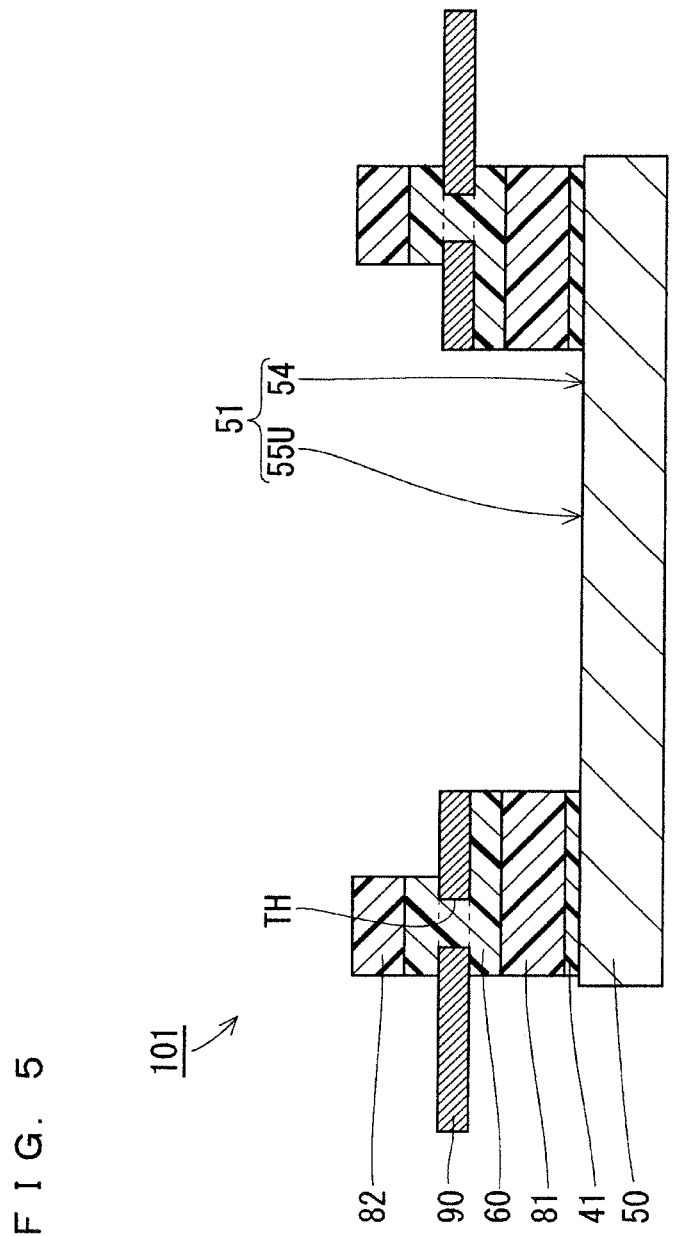
FIG. 5 is a schematic cross-sectional view taken along the line V-V of FIGS. 3 and 4.
Figure 6:
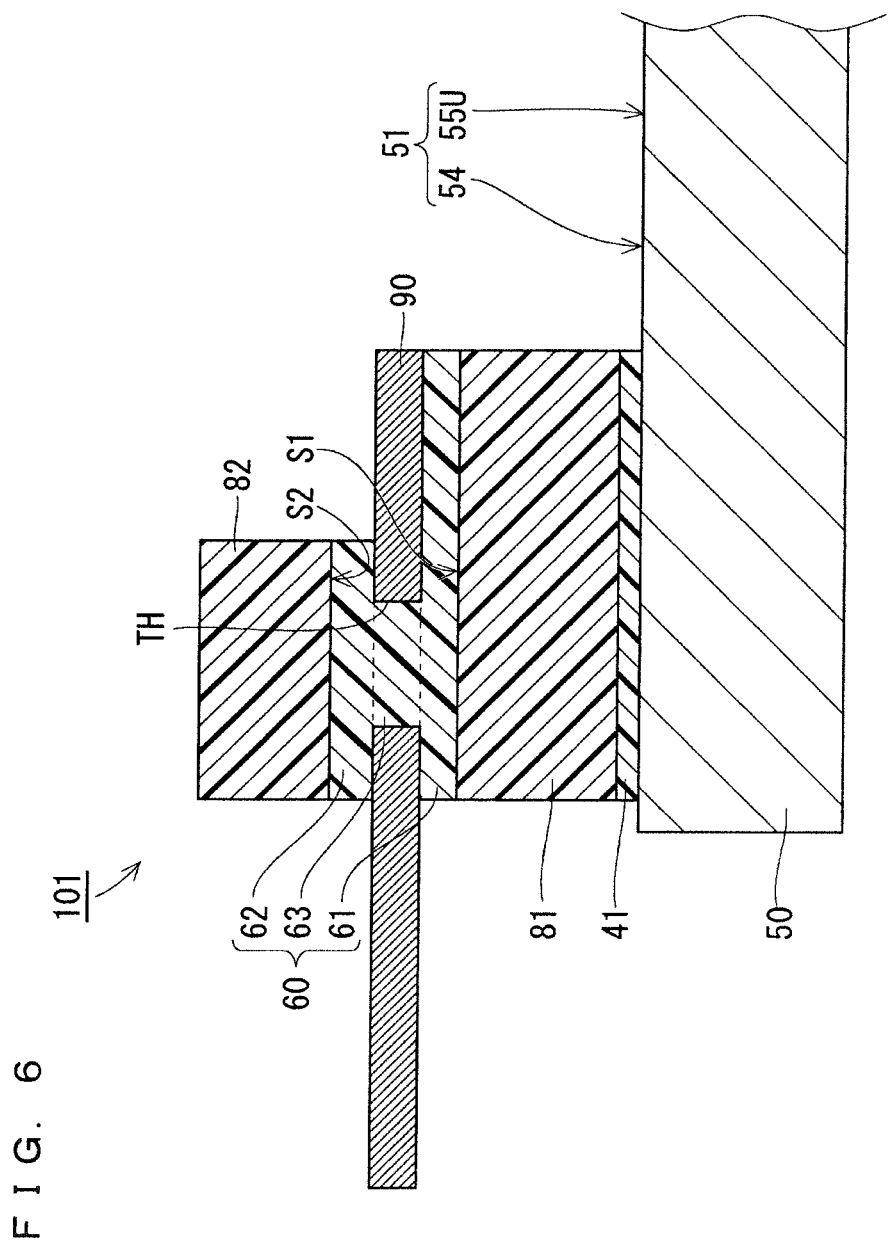
FIG. 6 is an enlarged view of a portion of FIG. 5.

FIG. 3 is a top view schematically showing a configuration of the package 101 in Embodiment 1. FIG. 4 is a top view schematically showing a configuration of the external terminal electrode 90 and the upper frame 82 (FIG. 5) of the package 101. FIG. 5 is a schematic cross-sectional view taken along the line V-V of FIG. 3. The line V-V corresponding to a cross section in FIG. 5 is also shown in FIG. 4. FIG. 6 is an enlarged view of a portion of FIG. 5.

The package 101 (FIG. 5) is to be used for the manufacture of the power semiconductor module 900 (FIG. 2). The lid 300 (FIG. 2) is to be attached to the package 101 to form the sealed space 950 (FIG. 2). The power semiconductor element 200 is sealed without a gross leak in the sealed space 950. The package 101 has, on the heat sink plate 50, a space surrounded by the lower frame 81 as a cavity to become the sealed space 950. Specifically, the package 101 includes the heat sink plate 50, the lower frame 81 (first frame), the upper frame 82 (a second frame), the external terminal electrode 90, and the adhesive layer 60. The package 101 may further include the heat sink adhesive layer 41.

The heat sink plate 50 supports the lower frame 81. The heat sink plate 50 has an inner surface 51 surrounded by the lower frame 81 in plan view. The inner surface 51 has an unmounted region 55U (FIG. 5) where the power semiconductor element 200 (FIG. 2) is to be mounted. The unmounted region 55U is a region where the power semiconductor element 200 is to be mounted while the power semiconductor element 200 has not yet been mounted. In other words, a portion of the inner surface 51 of the package 101 that becomes the mounted region 55M (FIG. 2) by being mounted by the power semiconductor element 200 is the unmounted region 55U (FIG. 5). The unmounted region 55U is preferably exposed. The inner surface 51 may also have a peripheral region 54 where the power semiconductor element 200 is not to be mounted. The heat sink plate 50 has an outer surface (a lower surface in FIG. 5) opposite the inner surface 51. The outer surface is usually attached to another member when the power semiconductor module 900 (FIG. 2) is in use, but may be exposed in the manufacture of the power semiconductor module 900.

The heat sink plate 50 is made of metal. The metal is preferably a non-composite material containing copper at a purity of 95.0 wt % (wt percent) or more, and is more preferably a non-composite material containing copper at a purity of 99.8 wt % or more. A plated layer, such as a nickel layer and a gold layer, may be added to the heat sink plate containing copper as a main component as described above.

The lower frame 81 is supported by the heat sink plate 50 through the heat sink adhesive layer 41. As described above, the lower frame 81 surrounds the unmounted region 55U of the heat sink plate 50 in plan view. The lower frame 81 has an upper surface S1 (a first surface). In FIG. 6, the lower frame 81 has a thickness of approximately 0.3 mm and a width of approximately 2 mm, for example.

The lower frame 81 contains a resin (first resin). The resin is preferably a thermoplastic resin, and is a liquid crystal polymer, for example. An inorganic filler (a first inorganic filler) is preferably dispersed in the resin. The inorganic filler preferably includes at least fibrous particles or plate-like particles. Due to the fibrous or plate-like shape, inhibition of flow of the resin by the filler is suppressed when the lower frame 81 is formed by injection molding technology and the like. Examples of a material for such an inorganic filler include silica glass fibers, alumina fibers, carbon fibers, talc ($3MgO \cdot 4SiO_2 \cdot 1H_2O$), wollastonite, mica, graphite, calcium carbonate, dolomite, glass flakes, glass beads, barium sulfate, and titanium oxide. An inorganic filler made of talc has a particle diameter of 1 μm to 50 μm on a flat plate, for example. The particle diameter is herein an arithmetical mean value of a longer diameter obtained by observation of a cross section of the resin. An inorganic filler content is preferably 30 wt % to 70 wt %. In a case where the coefficient of thermal expansion of the heat sink plate 50 is the same as or close to that of copper, the coefficient of thermal expansion of the inorganic filler is preferably 17 ppm/K or less in view of the coefficient of thermal expansion of copper. A material for the lower frame 81 is preferably heat resistant to heat treatment at 260° C. for two hours.

The upper frame 82 has a lower surface S2 (second surface) opposing the upper surface S1. In FIG. 6, the upper frame 82 has a thickness of approximately 0.3 mm, for example. The upper frame 82 contains a resin. A suitable material for the upper frame 82 is similar to the above-mentioned suitable material for the lower frame 81. The upper frame 82 may be made of the same material as the lower frame 81.

The external terminal electrode 90 passes between the upper surface S1 of the lower frame 81 and the lower surface S2 of the upper frame 82. The external terminal electrode 90 has a through hole TH between the upper surface S1 and the lower surface S2. The through hole TH may extend along the thickness (in a vertical direction in FIG. 5). The external terminal electrode 90 is made of metal, and preferably contains copper at a purity of 90 wt % (weight percent) or more. In place of such a material containing copper at a high purity, Kovar®, an iron-nickel alloy, or the like may be used. The external terminal electrode 90 may have a surface made of gold. Joining of the external terminal electrode 90 to another member, such as the bonding wire 205 (FIG. 2), is thus likely to be secured. The surface made of gold of the external terminal electrode 90 may be in contact with the adhesive layer 60. The surface made of gold is typically formed by gold plating. A nickel plating may be formed under the gold plating.

In a region where the adhesive layer 60 (FIG. 6) overlaps the external terminal electrode 90 (see FIG. 4) in plan layout, the adhesive layer 60 includes a lower portion 61 (first portion), an upper portion 62 (a second portion), and an intermediate portion 63 (a third portion). The above-mentioned region herein includes a portion in which the through hole TH is disposed. The lower portion 61 connects the external terminal electrode 90 and the upper surface S1 of the lower frame 81 to each other along the thickness. The upper portion 62 connects the external terminal electrode 90 and the lower surface S2 of the upper frame 82 to each other along the thickness. The intermediate portion 63 is disposed within the through hole TH of the external terminal electrode 90, and connects the lower portion 61 and the upper portion 62 to each other. In a region offset from the external terminal electrode 90 in plan layout, the adhesive layer 60 includes a portion connecting the lower frame 81 and the upper frame 82 to each other along the thickness without the external terminal electrode 90 therebetween.

The adhesive layer 60 is made of a different material from the lower frame 81 and the upper frame 82. The adhesive layer 60 contains a resin (second resin) different from the resin of the lower frame 81 (first resin). The resin of the adhesive layer 60 is preferably a thermosetting resin in terms of heat resistance and high fluidity before curing, and is an epoxy resin, for example. An inorganic filler may be dispersed in the resin of the adhesive layer 60.

The heat sink adhesive layer 41 adheres the lower frame 81 and the heat sink plate 50 to each other. The heat sink adhesive layer 41 is made of a different material from the lower frame 81. The heat sink adhesive layer 41 may be made of the same material as the adhesive layer 60. A resin of the heat sink adhesive layer 41 is preferably a thermosetting resin in terms of heat resistance and high fluidity before curing, and is an epoxy resin, for example.

An inorganic filler is preferably dispersed in the resin of the heat sink adhesive layer 41. The inorganic filler preferably contains at least silica glass or crystalline silica, and is more preferably made of silica glass. Silica glass and crystalline silica typically have a coefficient of thermal expansion of approximately 0.5 ppm/K and a coefficient of thermal expansion of approximately 15 ppm/K, respectively, and thus the inorganic filler can have a coefficient of thermal expansion of 17 ppm/K or less. This is particularly desirable in a case where an epoxy resin or a fluororesin is used as the resin of the heat sink adhesive layer 41. In this case, an inorganic filler content is preferably 50 wt % to 90 wt %. In place of or together with at least silica glass or crystalline silica, at least any of alumina, aluminum hydroxide, talc, iron oxide, wollastonite, calcium carbonate, mica, titanium oxide, and carbon fibers may be used. The inorganic filler has a spherical, fibrous, or plate-like shape, for example. On the other hand, in a case where a silicone resin is used as the resin of the heat sink adhesive layer 41, a restriction of the coefficient of thermal expansion of the inorganic filler is substantially negligible as the silicone resin has rubber elasticity. In this case, an inorganic filler content may be adjusted in terms of control of fluidity of the heat sink adhesive layer 41 and the like, and is preferably 1 wt % to 10 wt %. Spherical silica glass (non-crystalline silica) having a particle diameter of 1 μm to 50 μm is optimal in terms of securement of fluidity of the heat sink adhesive layer 41 before curing.

A method for manufacturing the power semiconductor module 900 (FIG. 2) will be described next. The package 101 (FIG. 5) is prepared first.

The power semiconductor element 200 (FIG. 2) is then mounted on the unmounted region 55U (FIG. 5) of the heat sink plate 50. The exposed unmounted region 55U thus becomes the mounted region 55M (FIG. 2) covered with the power semiconductor element 200. It is preferable that, when the power semiconductor element 200 is mounted, the unmounted region 55U of the heat sink plate 50 and the power semiconductor element 200 be joined to each other through the joining layer 42 (FIG. 2) containing the thermosetting resin and the metal. In other words, it is preferable that the joining be performed by application and curing of the pasty adhesive containing the thermosetting resin and the metal. The thermosetting resin of the joining layer 42 preferably includes an epoxy resin. The metal of the joining layer 42 preferably includes silver.

The power semiconductor element 200 and the external terminal electrode 90 are then connected by the bonding wire 205 (FIG. 2) in the cavity of the package 101. Electrical connection between the power semiconductor element 200 and the external terminal electrode 90 is thereby secured.

The lid 300 is then attached to the upper frame 82 to seal the power semiconductor element 200 without a gross leak. The power semiconductor module 900 is thereby obtained. Specifically, the upper frame 82 and the lid 300 are adhered to each other by the adhesive layer 46. The lid 300 is attached to the package 101 so as not to thermally damage the package 101 on which the power semiconductor element 200 has been mounted to such a degree that a gross leak is caused. In other words, the lid 300 is attached to the package 101 so as not to thermally damage the heat sink adhesive layer 41 and the adhesive layer 60 to such a degree that a gross leak is caused. For example, the lid 300 is attached to the package 101 through the adhesive layer 46 cured at a curing temperature low enough not to lead to the above-mentioned thermal damage. The curing temperature is less than 260° C., for example.

Figure 7:
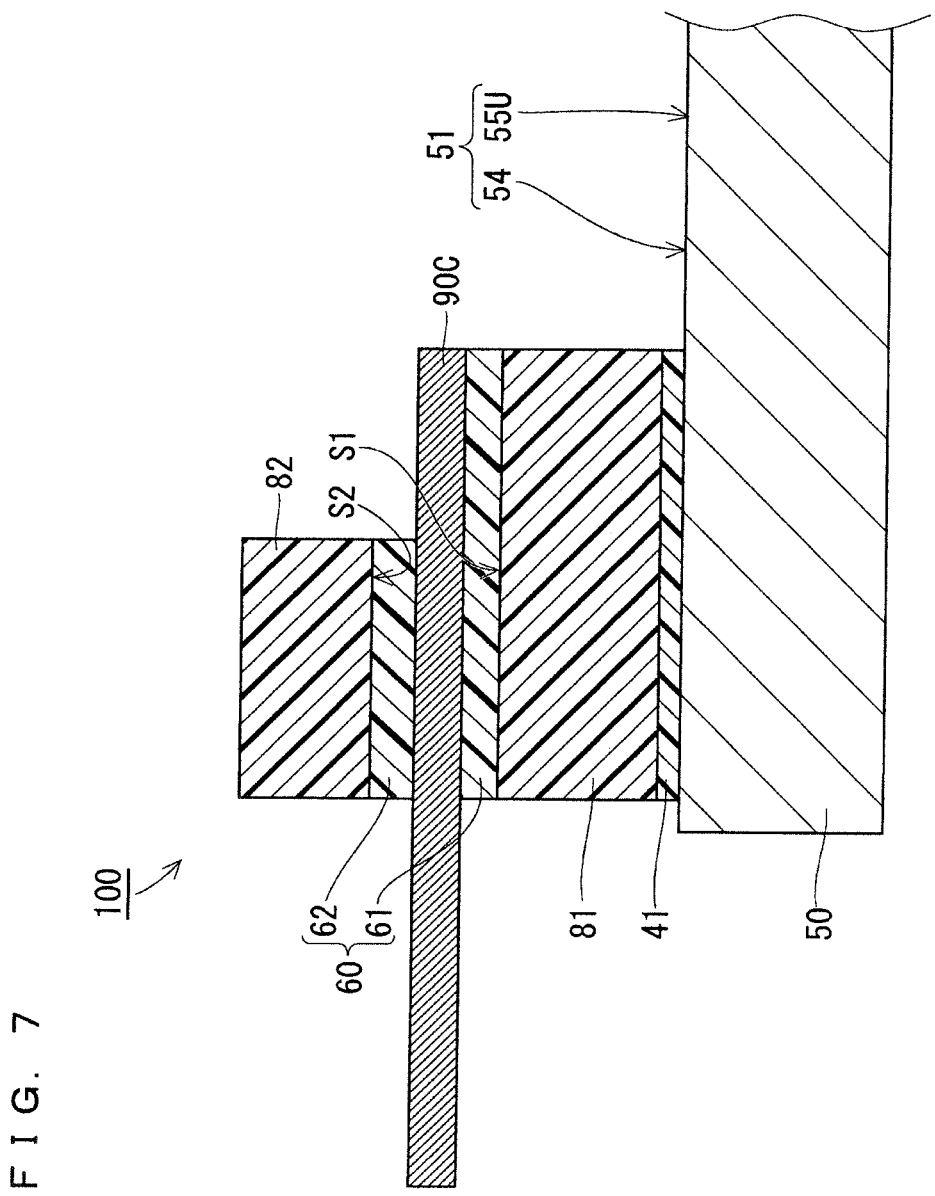
FIG. 7 is a cross-sectional view showing a configuration of a package in a comparative example in a view corresponding to FIG. 6.

FIG. 7 is a cross-sectional view showing a configuration of a package 100 in a comparative example in a view corresponding to FIG. 6 (the package 101 in the present embodiment). In contrast to the external terminal electrode 90 (FIG. 6), an external terminal electrode 90C of the package 100 does not have the through hole TH. As a result, the adhesive layer 60 does not include the intermediate portion 63 (FIG. 6) in the package 100. An upper surface of the lower portion 61 and a lower surface of the upper portion 62 are thus each connected only to the external terminal electrode 90C. In a case where an adhesion strength between the adhesive layer 60 and the external terminal electrode 90C is low, the upper surface of the lower portion 61 or the lower surface of the upper portion 62 and the external terminal electrode 90C are likely to be separated from each other. The separation can cause a gross leak. In particular, a surface made of gold of the external terminal electrode 90C is sometimes less likely to firmly adhere to the adhesive layer 60 made of a resin-based material. Furthermore, in particular, an adhesion strength between the surface made of gold of the external terminal electrode 90C and the adhesive layer 60 containing the epoxy resin is likely to be low.

According to the package 101 (FIG. 6) in the present embodiment, the adhesive layer 60 includes the lower portion 61 connecting the external terminal electrode 90 and the upper surface S1 of the lower frame 81 to each other, the upper portion 62 connecting the external terminal electrode 90 and the lower surface S2 of the upper frame 82 to each other, and the intermediate portion 63 disposed within the through hole TH of the external terminal electrode 90 and connecting the lower portion 61 and the upper portion 62 to each other. The intermediate portion 63 fixes relative positions of the lower portion 61 and the upper portion 62 along the thickness. Separation between the lower portion 61 or the upper portion 62 and the external terminal electrode 90 along the thickness is thereby prevented. A gross leak caused due to separation of the adhesive layer 60 can thus be prevented.

The external terminal electrode 90 may have the surface which is in contact with the adhesive layer 60 and made of gold. A combination of the surface made of gold and the resin-based adhesive layer is typically likely to lead to reduction in adhesion strength. According to the present embodiment, separation between the external terminal electrode 90 and the adhesive layer 60 due to a low adhesion strength can effectively be prevented.

The adhesive layer 60 may contain the epoxy resin. An adhesion strength to each of the lower frame 81 and the upper frame 82 containing a resin is thus likely to be secured. On the other hand, according to the present embodiment, separation between the adhesive layer 60 and the external terminal electrode 90 is prevented for the above-mentioned reason. As described above, separation in a stacked structure of the lower frame 81, the adhesive layer 60, the external terminal electrode 90, and the upper frame 82 as a whole can be prevented. In particular, an adhesion strength between the surface made of gold of the external terminal electrode 90 and the adhesive layer 60 containing the epoxy resin is likely to be low, but separation therebetween is prevented for the above-mentioned reason.

The heat sink plate 50 is preferably made of the non-composite material containing copper at a purity of 95.0 wt % or more. A high thermal conductivity of more than 300 W/m·K can thus easily be obtained. For example, a high thermal conductivity of 347 W/m·K can be obtained by using a material (containing copper at a purity of 99.82 wt % or more) set forth in Japanese Industrial Standards (JIS) C 1510. Before mounting of the power semiconductor element 200 (FIG. 2), the heat sink plate 50 has, within the lower frame 81, the unmounted region 55U (FIG. 5) where the power semiconductor element 200 is to be mounted. In other words, the lower frame 81 has already been attached to the heat sink plate 50 when the power semiconductor element 200 is mounted. A process of attaching the lower frame 81 to the heat sink plate 50 is thus not required after mounting of the power semiconductor element 200. As described above, the power semiconductor module 900 (FIG. 2) can promptly be completed after mounting of the power semiconductor element 200 while the heat sink plate 50 having a high thermal conductivity is used.

The unmounted region 55U (FIG. 5) is preferably exposed. The power semiconductor element 200 (FIG. 2) can thereby easily be mounted on the unmounted region 55U (FIG. 5).

According to the method for manufacturing the power semiconductor module 900 (FIG. 2) in the present embodiment, after the package 101 (FIG. 5) is formed, the power semiconductor element 200 is mounted on the heat sink plate 50 (FIG. 5) of the package 101. Thus, after the adhesive layer 60 connecting the lower frame 81, the external terminal electrode 90, and the upper frame 82 to one another is formed, the power semiconductor element 200 is mounted on the heat sink plate 50. The mounting requires heating, and thus the temperature of the adhesive layer 60 increases. A material for the adhesive layer 60 is thus limited to a highly heat resistant material. Priority is thus less likely to be given to securement of the adhesion strength between the adhesive layer 60 and the external terminal electrode 90. On the other hand, according to the present embodiment, the adhesive layer 60 includes the lower portion 61 connecting the external terminal electrode 90 and the upper surface S1 of the lower frame 81 to each other, the upper portion 62 connecting the external terminal electrode 90 and the lower surface S2 of the upper frame 82 to each other, and the intermediate portion 63 disposed within the through hole TH of the external terminal electrode 90 and connecting the lower portion 61 and the upper portion 62 to each other. The intermediate portion 63 fixes the relative positions of the lower portion 61 and the upper portion 62 along the thickness. Separation between the lower portion 61 or the upper portion 62 and the external terminal electrode 90 along the thickness is thereby prevented. A gross leak caused due to separation of the adhesive layer 60 can thus be prevented.

It is preferable that, when the power semiconductor element 200 is mounted, the unmounted region 55U (FIG. 5) of the heat sink plate 50 and the power semiconductor element 200 be joined to each other through the joining layer 42 (FIG. 2) containing the thermosetting resin and the metal. The joining layer 42 contains the metal to enhance heat dissipation from the power semiconductor element 200 to the heat sink plate 50. The joining layer 42 contains the resin to relieve thermal stress applied from the heat sink plate 50 to the power semiconductor element 200 through the joining layer 42. Rupture of the power semiconductor element 200 due to thermal stress is thus less likely to occur.

Embodiment 2

Figure 8:
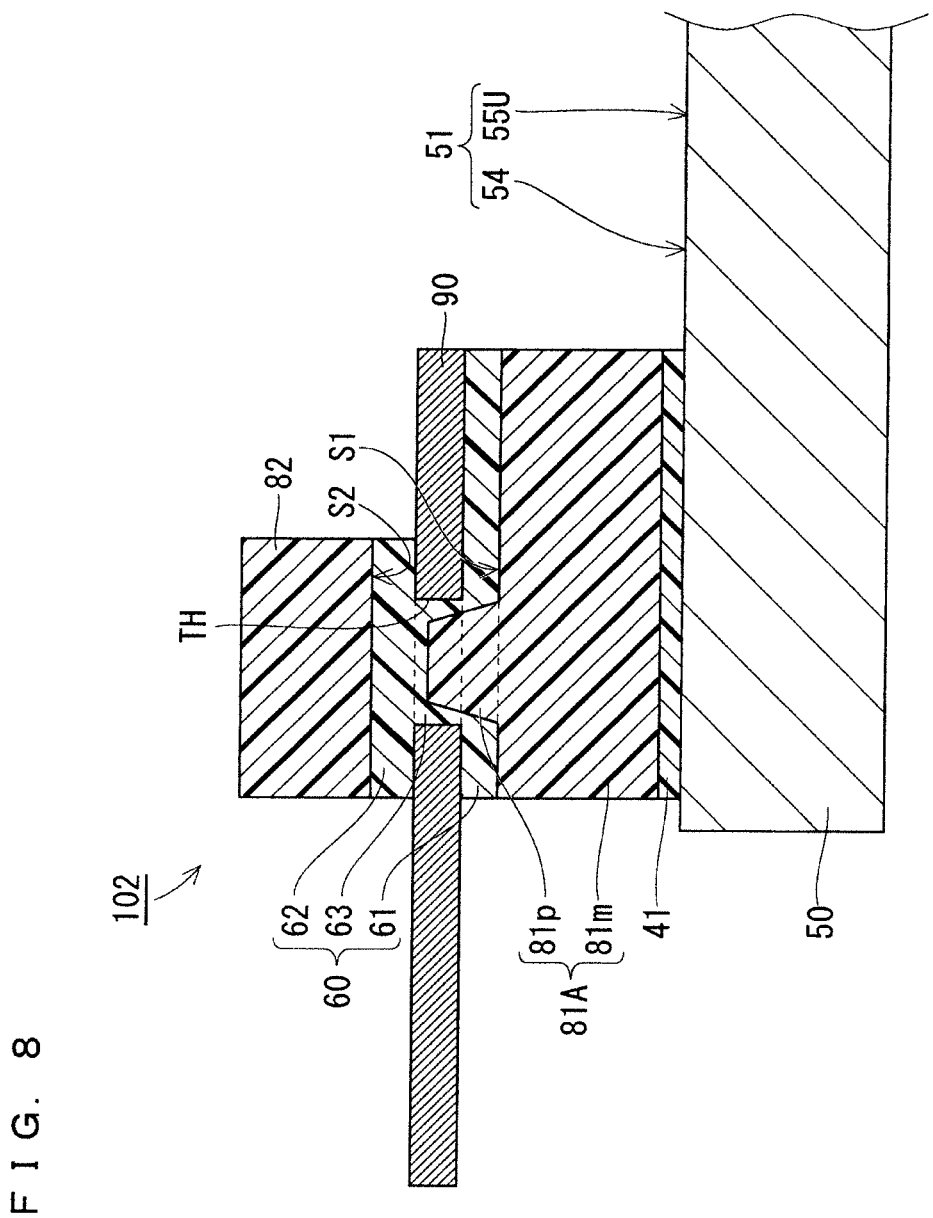
FIG. 8 is a partial cross-sectional view schematically showing a configuration of a package in Embodiment 2 of the present invention in the view corresponding to FIG. 6.

FIG. 8 is a partial cross-sectional view schematically showing a configuration of a package 102 in Embodiment 2 in the view corresponding to FIG. 6 (Embodiment 1). The package 102 includes a lower frame 81A (first frame) in place of the lower frame 81 (FIG. 6: Embodiment 1). The lower frame 81A includes a major portion 81*m* and a protruding portion 81*p*. The protruding portion 81*p* protrudes from the major portion 81*m* toward the through hole TH of the external terminal electrode 90. The protruding portion 81p is preferably spaced apart from the external terminal electrode 90. The protruding portion 81p is also preferably spaced apart from the upper frame 82. The protruding portion 81p preferably penetrates into the through hole TH of the external terminal electrode 90.

Figure 9:
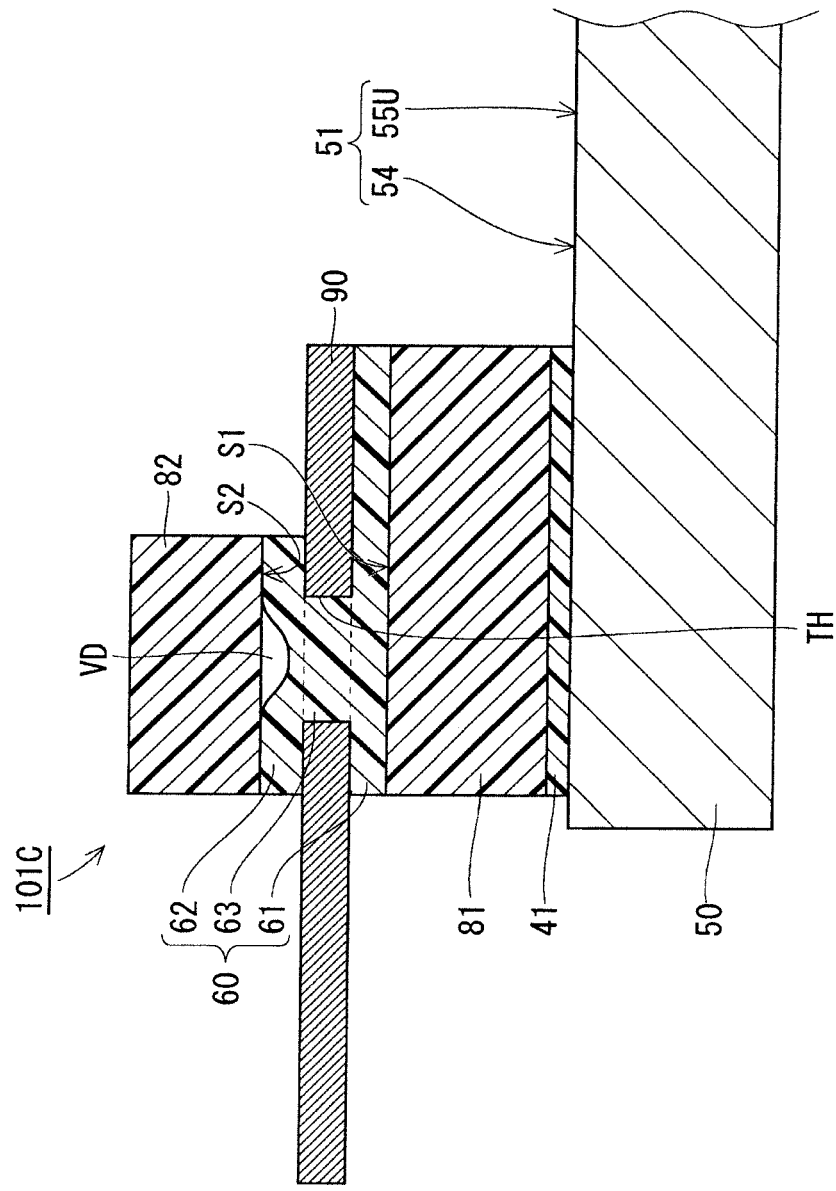
FIG. 9 is a partial cross-sectional view schematically showing a configuration of a package in an example to be a reference for Embodiment 2 of the present invention in a view corresponding to FIG. 8.

FIG. 9 is a partial cross-sectional view schematically showing a configuration of a package 101C in an example to be a reference for Embodiment 2 in a view corresponding to FIG. 8. The package 101C includes the lower frame 81 similar to that in Embodiment 1 in place of the lower frame 81A (FIG. 8: Embodiment 2). In other words, the package 101C does not include the protruding portion 81p (FIG. 8). The volume of a space where the adhesive layer 60 can be formed near the through hole TH is thus locally large. A void VD is thus likely to be formed near the through hole TH due to insufficient filling with the adhesive layer 60 at the manufacture. A gas is sometimes generated from the void VD into the sealed space 950 (see FIG. 2), and this is not desirable for the power semiconductor element 200.

According to the present embodiment, the lower frame 81A includes the protruding portion 81p protruding toward the through hole TH of the external terminal electrode 90. The volume of the space where the adhesive layer 60 can be formed near the through hole TH is thus reduced. Formation of the void VD (FIG. 9) near the through hole TH is thus prevented. Generation of the gas from the void VD into the sealed space 950 (see FIG. 2) can thus be prevented.

The protruding portion 81p is preferably spaced apart from the external terminal electrode 90. In this case, disturbance of relative positions of the lower frame 81A and the external terminal electrode 90 due to a collision therebetween at the manufacture of the package 102 is prevented. The occurrence of a gross leak due to an error of the positions can thus be prevented.

The protruding portion 81p preferably penetrates into the through hole TH of the external terminal electrode 90. The volume of the space where the adhesive layer 60 can be formed near the through hole TH is thus more sufficiently reduced. Formation of the void VD near the through hole TH is thus more sufficiently prevented. Generation of the gas from the void VD into the sealed space 950 can thus more sufficiently be prevented.

Figure 10:
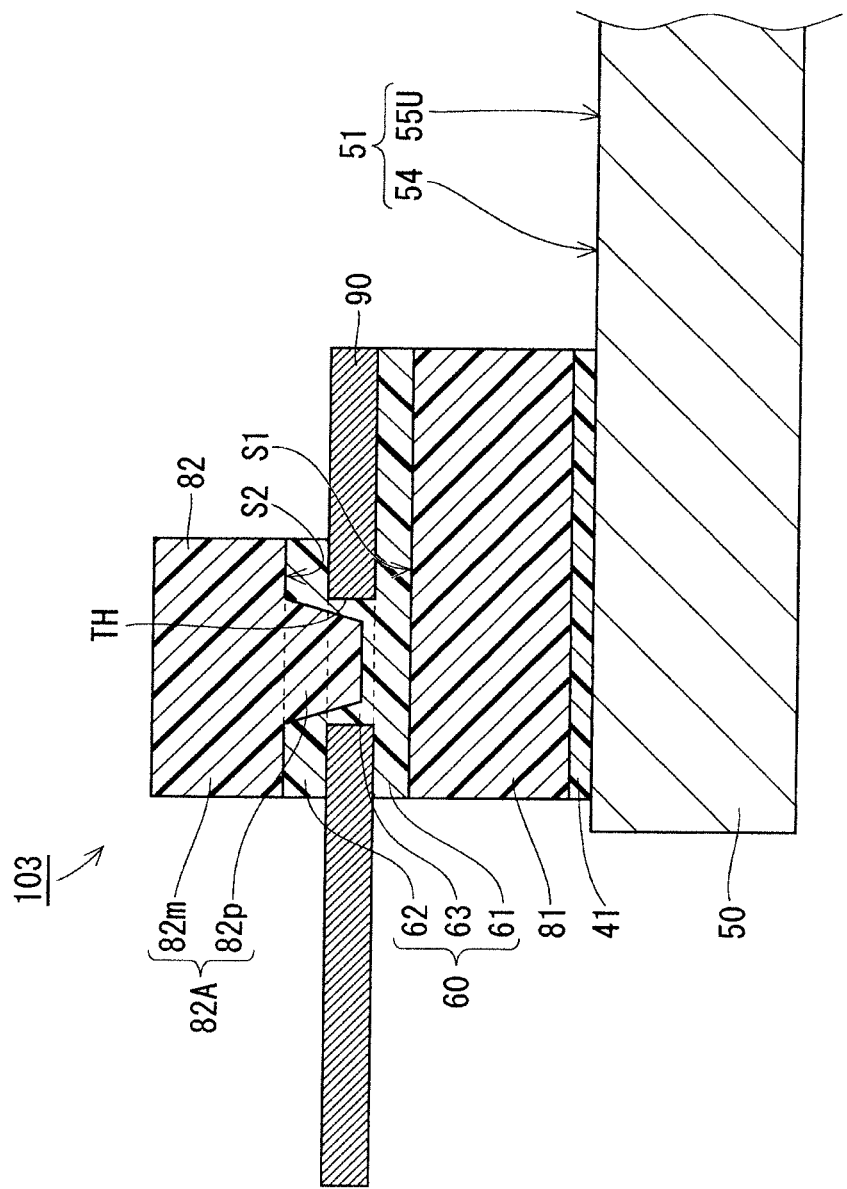
FIG. 10 is a partial cross-sectional view schematically showing a modification of FIG. 8.

FIG. 10 is a partial cross-sectional view schematically showing a package 103 in a modification of the package 102 (FIG. 8) in the present embodiment. The package 103 includes an upper frame 82A (second frame) in place of the upper frame 82 (FIG. 6: Embodiment 1). The upper frame 82A includes a major portion 82m and a protruding portion 82p. The protruding portion 82p protrudes from the major portion 82m toward the through hole TH of the external terminal electrode 90. The protruding portion 82p is preferably spaced apart from the external terminal electrode 90. The protruding portion 82p is also preferably spaced apart from the lower frame 81. The protruding portion 82p preferably penetrates into the through hole TH of the external terminal electrode 90. An effect substantially similar to the effect obtained in Embodiment 2 described above can be obtained in the present modification.

As another modification, the lower frame and the upper frame may each include a protruding portion protruding toward the through hole TH of the external terminal electrode 90. In other words, the package may include the lower frame 81A (FIG. 8) and the upper frame 82A (FIG. 10).

Embodiment 3

Figure 11:
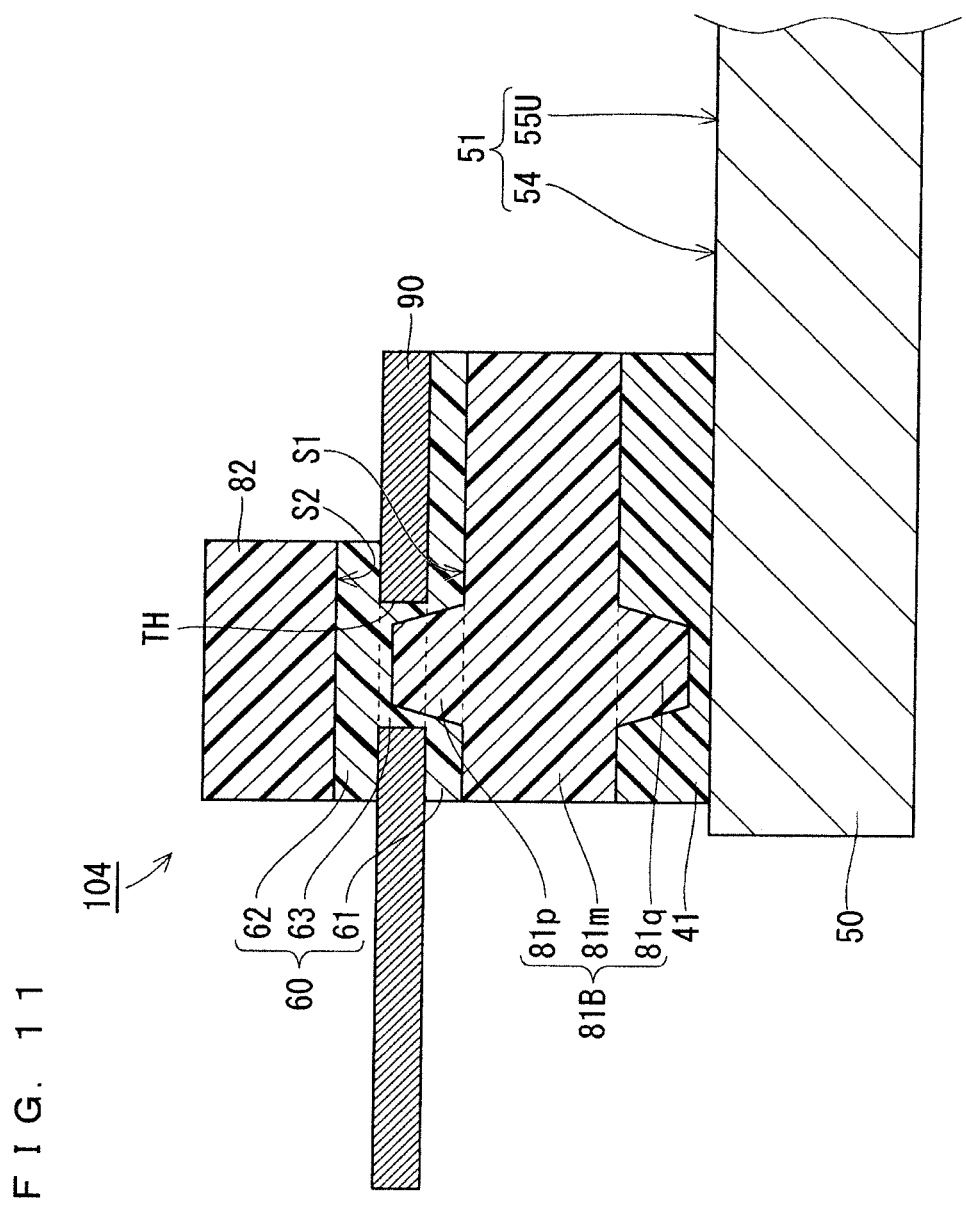
FIG. 11 is a partial cross-sectional view schematically showing a configuration of a package in Embodiment 3 of the present invention in the view corresponding to FIG. 8.

FIG. 11 is a partial cross-sectional view schematically showing a configuration of a package 104 in Embodiment 3 in the view corresponding to FIG. 8 (the package 102 in Embodiment 2). The package 104 includes a lower frame 81B (first frame) in place of the lower frame 81A (FIG. 8: Embodiment 2). The lower frame 81B includes a protruding portion 81q in addition to the major portion 81m and the protruding portion 81p of the lower frame 81A. The protruding portion 81q protrudes, in the heat sink adhesive layer 41, from the major portion 81m toward the heat sink plate 50. The protruding portion 81q is spaced apart from the heat sink plate 50. The height (a vertical dimension in FIG. 11) of the protruding portion 81q is preferably 0.02 mm or more, and is more preferably 0.05 mm or more. The protruding portion 81q is preferably tapered in a direction in which the protruding portion 81q is protruding, that is, downward in FIG. 11.

According to the present embodiment, the heat sink adhesive layer 41 can have a larger thickness between the heat sink plate 50 and the major portion 81m of the lower frame 81B than between the heat sink plate 50 and the lower frame 81A. The heat sink adhesive layer 41 can thus easily and surely have a sufficiently thick portion. The sufficiently thick portion is elastically deformed to relieve stress caused by a difference in thermal expansion between the lower frame 81B and the heat sink plate 50. Hermeticity deterioration caused by repeated temperature changes made to the package 104 can thereby be suppressed.

In particular, in a case where the heat sink adhesive layer 41 contains the filler, the thickness of the heat sink adhesive layer 41 between the heat sink plate 50 and the protruding portion 81q of the lower frame 81B is usually greater than the particle diameter of the filler. The thickness of the heat sink adhesive layer 41 between the heat sink plate 50 and the major portion 81m of the lower frame 81B can thus easily be greater than the sum of the particle diameter of the filler and the height of the protruding portion 81q.

As described above, the thickness of the above-mentioned thick portion of the heat sink adhesive layer 41 is substantially determined by the shape of the protruding portion 81q and the material for the heat sink adhesive layer 41, and little depends on a condition of a load put on the heat sink adhesive layer 41 before curing. Variation in thickness of the heat sink adhesive layer 41 is thereby suppressed. The stress relieving effect of the heat sink adhesive layer 41 can thus stably be obtained.

Furthermore, due to the protruding portion 81q, a fluid layer to become the heat sink adhesive layer 41 is held on the protruding portion 81q by interfacial tension. The fluid layer is thus less likely to flow to the unmounted region 55U. The occurrence of bleeding can thus be suppressed.

Furthermore, due to the protruding portion 81q in addition to the protruding portion 81p, symmetry of the lower frame 81B is enhanced. This facilitates dimensional control of the lower frame 81B.

While the invention has been described in detail, the foregoing description is in all aspects illustrative and not restrictive. It is therefore understood that numerous unillustrated modifications can be devised without departing from the scope of the invention.

What is claimed is:

1. A package to which a lid is to be attached to form a sealed space for sealing a power semiconductor element without a gross leak, the package comprising:
   a heat sink plate having an unmounted region where the power semiconductor element is to be mounted, and being made of metal;

a first frame being supported by the heat sink plate, surrounding the unmounted region of the heat sink plate in plan view, containing a resin, and having a first surface;

a second frame containing a resin, and having a second surface opposing the first surface;

an external terminal electrode passing between the first surface of the first frame and the second surface of the second frame, and having a through hole between the first surface of the first frame and the second surface of the second frame; and an adhesive layer containing a resin, and including a first portion, a second portion, and a third portion, the first portion connecting the external terminal electrode and the first surface of the first frame to each other, the second portion connecting the external terminal electrode and the second surface of the second frame to each other, the third portion being disposed within the through hole of the external terminal electrode and connecting the first portion and the second portion to each other.

2. The package according to claim 1, wherein at least one of the first frame and the second frame includes a protruding portion protruding toward the through hole of the external terminal electrode.

3. The package according to claim 2, wherein the protruding portion is spaced apart from the external terminal electrode.

4. The package according to claim 2, wherein the protruding portion penetrates into the through hole of the external terminal electrode.

5. The package according to claim 1, wherein the external terminal electrode has a surface which is in contact with the adhesive layer and made of gold.

6. The package according to claim 1, wherein the adhesive layer contains an epoxy resin.

7. A method for manufacturing a power semiconductor module, the method comprising:

preparing a package, the package including:
  a heat sink plate made of metal;
  a first frame being supported by the heat sink plate, containing a resin, and having a first surface;
  a second frame containing a resin, and having a second surface opposing the first surface;
  an external terminal electrode passing between the first surface of the first frame and the second surface of the second frame, and having a through hole between the first surface of the first frame and the second surface of the second frame; and
  an adhesive layer containing a resin, and including a first portion, a second portion, and a third portion, the first portion connecting the external terminal electrode and the first surface of the first frame to each other, the second portion connecting the external terminal electrode and the second surface of the second frame to each other, the third portion being disposed within the through hole of the external terminal electrode and connecting the first portion and the second portion to each other;

mounting a power semiconductor element on the heat sink plate; and attaching a lid to the second frame to seal the power semiconductor element without a gross leak.

8. The method for manufacturing the power semiconductor module according to claim 7, wherein the mounting of the power semiconductor element includes joining the heat sink plate and the power semiconductor element to each other through a joining layer containing a thermosetting resin and a metal.

* * * * *